United States Patent
Dobrovolny

(10) Patent No.: US 6,675,005 B2
(45) Date of Patent: Jan. 6, 2004

(54) PRINTED SINGLE BALANCED DOWNCONVERTER MIXER

(75) Inventor: Pierre Dobrovolny, North Riverside, IL (US)

(73) Assignee: Zenith Electronics Corporation, Lincolnshire, IL (US)

(*) Notice: Subject to any disclaimer, the term of this patent is extended or adjusted under 35 U.S.C. 154(b) by 0 days.

(21) Appl. No.: 09/850,821

(22) Filed: May 8, 2001

(65) Prior Publication Data

US 2002/0022466 A1 Feb. 21, 2002

Related U.S. Application Data

(63) Continuation-in-part of application No. 09/275,949, filed on Mar. 25, 1999, now abandoned.

(51) Int. Cl.[7] .................................. H03H 7/00
(52) U.S. Cl. ............... 455/327; 455/307; 455/330; 455/333; 333/177; 333/125; 333/209
(58) Field of Search ............... 455/327, 326, 455/330, 307, 339, 323–325, 333, 328, 318, 319, 81; 333/177, 185, 204, 175–176, 246, 25–26, 32, 24 R, 117, 118, 119, 120, 238, 121, 123, 136; 327/113

(56) References Cited

U.S. PATENT DOCUMENTS

| | | | | |
|---|---|---|---|---|
| 4,619,001 A | * | 10/1986 | Kane | 455/192.3 |
| 5,062,149 A | * | 10/1991 | Hulderman et al. | 455/323 |
| 5,115,217 A | * | 5/1992 | McGrath et al. | 333/246 |
| 5,125,111 A | * | 6/1992 | Trinh | 455/327 |
| 5,266,963 A | * | 11/1993 | Carter | 343/850 |
| 5,303,419 A | * | 4/1994 | Ittipiboon et al. | 455/37 |
| 5,307,518 A | * | 4/1994 | Maeda et al. | 455/326 |
| 5,339,462 A | * | 8/1994 | Staudinger et al. | 455/330 |
| 5,428,840 A | * | 6/1995 | Sadhir | 455/326 |
| 5,430,895 A | * | 7/1995 | Huusko | 455/327 |
| 5,465,416 A | | 11/1995 | Yanagimoto | |
| 5,551,074 A | * | 8/1996 | Vice | 455/326 |
| 5,633,613 A | * | 5/1997 | MacDonald | 332/163 |
| 5,705,960 A | | 1/1998 | Izumiyama | |
| 5,745,017 A | * | 4/1998 | Ralph | 333/116 |
| 5,790,945 A | * | 8/1998 | Erickson | 455/325 |
| 5,903,827 A | | 5/1999 | Kennan et al. | |
| 5,917,386 A | * | 6/1999 | Dobrovolny | 333/119 |
| 5,920,245 A | | 7/1999 | Ishikawa et al. | |
| 5,987,315 A | | 11/1999 | Nishida | |
| 6,026,286 A | | 2/2000 | Long | |
| 6,064,872 A | | 5/2000 | Vice | |
| 6,115,594 A | | 9/2000 | Pozdeev et al. | |

FOREIGN PATENT DOCUMENTS

DE 2023954 A 11/1970

* cited by examiner

*Primary Examiner*—Pablo N Tran

(57) ABSTRACT

A single balanced downconverter includes an insulated substrate with a primary circuit and a secondary circuit, each consisting of an open annular foil element, located on opposite sides of the substrate in juxtaposition with each other and having mutual coupling. A pair of mixing diodes is connected across the ends of the secondary element, which has its center connected to ground. A $2^{nd}$ local oscillator signal is applied to the primary circuit. A $1^{st}$ IF signal is applied to, and a $2^{nd}$ IF signal is developed from, the secondary circuit.

4 Claims, 1 Drawing Sheet

PRINTED SINGLE BALANCED DOWNCONVERTER MIXER

CROSS REFERENCE TO RELATED APPLICATIONS

This application is a Continuation in Part of application Ser. No. 09/275,949 filed Mar. 25, 1999, entitled PRINTED SINGLE BALANCED DOWNCONVERTER MIXER, now abandoned, and is related to application Ser. No. 08/815,561, filed Mar. 12, 1997, entitled PRINTED CIRCUIT TRANSFORMER HYBRIDS FOR RF MIXERS and application Ser. No. 09/276,066, filed Mar. 25, 1999 entitled PRINTED CIRCUIT DOUBLY BALANCED MIXER FOR UPCONVERTER all in the name of the inventor and all of which are assigned to Zenith Electronics Corporation.

BACKGROUND OF THE INVENTION

This invention relates to broadband RF downconverter mixers (used in television and satellite receivers) that operate up into the gigaHertz range of frequencies. As is well known, operations at such frequencies make component configurations, circuit layout, lead lengths and placement extremely critical. This is one of the reasons conventional ferrite core type coils and transformer hybrids are difficult to use in high frequency broadband RF mixer circuits. Another reason is the loss associated with the ferrite material. The present invention utilizes the printed circuit construction techniques, disclosed and claimed in application Ser. No. 08/815,561 above, for producing a precision RF downconverter mixer that minimizes lead length problems, reduces losses and avoids much costly and time consuming labor.

OBJECTS OF THE INVENTION

A principal object of the invention is to provide a novel RF downconverter mixer.

Another object of the invention is to provide a printed circuit type RF downconverter mixer.

BRIEF DESCRIPTION OF THE DRAWINGS

These and other objects and advantages of the invention will be apparent upon reading the following description in conjunction with the drawings in which.

DETAILED DESCRIPTION OF THE INVENTION

Figure 1:
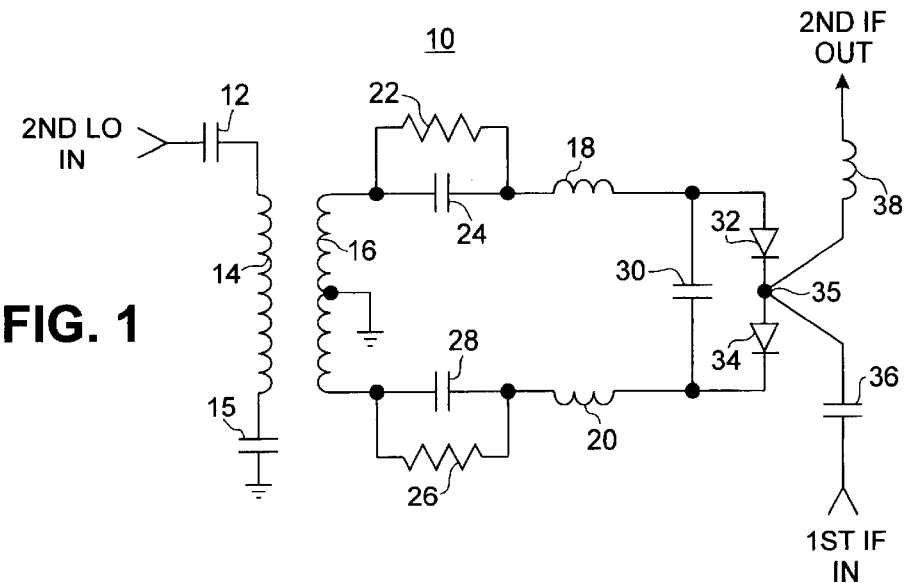
FIG. 1 is a simplified schematic diagram of an RF downconverter mixer constructed in accordance with the invention.
Figure 2:
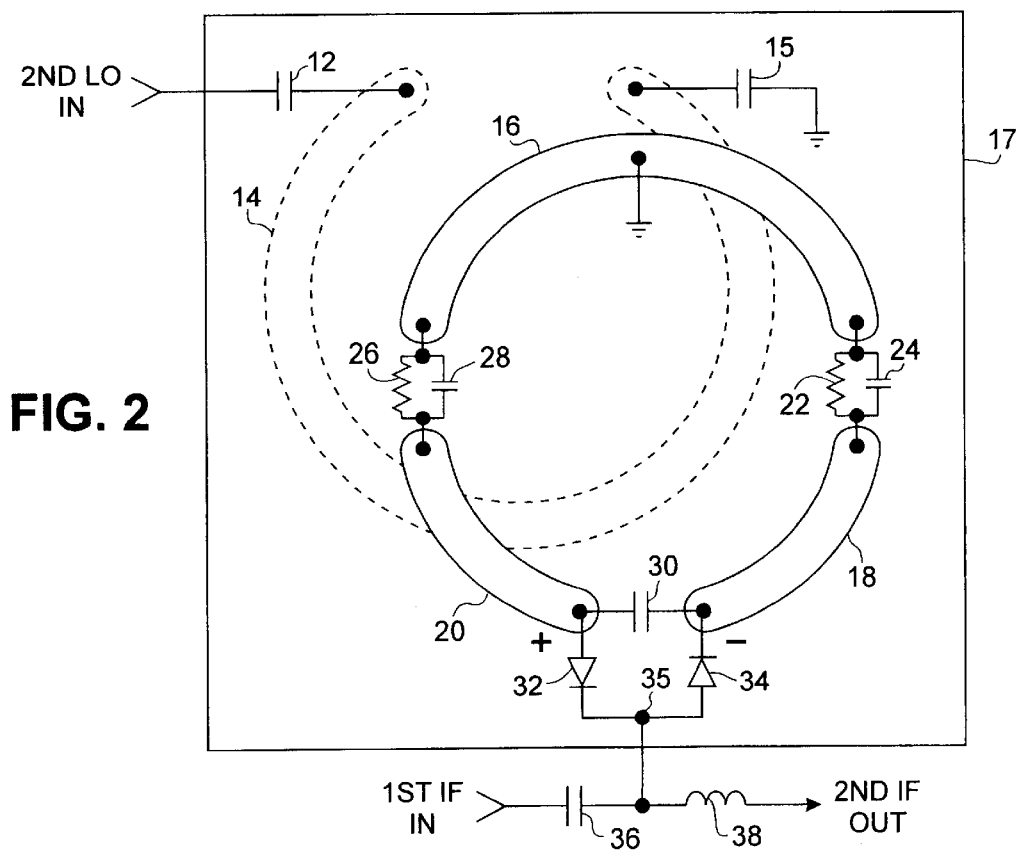
FIG. 2 illustrates the layout of the printed circuit board RF down converter mixer of the invention.

Referring to FIGS. 1 and 2, a downconverter mixer 10 receives a $2^{nd}$ local oscillator (LO) signal from a source (not shown) via a capacitor 12. The incoming LO frequency is in the vicinity of 876 megaHertz (MHz) and will cause switching (mixing) of an incoming 920 MHz $1^{st}$ IF signal from the upconverter (not shown) to develop a 44 MHz $2^{nd}$ IF output signal. The downconverter mixer operation is well known in the art and needs no further elaboration. Capacitor 12 is coupled at one end to a primary circuit that consists of an open annular foil element 14 on one side of a printed circuit substrate 17. The other end of foil element 14 is connected to a suitable ground through a capacitor 15. A secondary circuit includes three foil elements 16, 18 and 20 that are situated on the opposite side of substrate 17 and juxtaposed to foil element 14. It will be appreciated that the primary and secondary circuits are mutually coupled to each other to enable transformer action to occur. The primary circuit is series resonant at the LO frequency, that is the capacitances of capacitors 12 and 15 are the same (or nearly so) and their series combination tunes out the inductance of element 14 at the LO frequency. This arrangement provides good coupling balance between the primary and secondary circuits.

Those skilled in the art will recognize that, if a single capacitor were to be used in the primary circuit, the unavoidable parasitic capacitances that exist between foil elements 14 and 16 would introduce an unbalance between the LO signal across diode 32 and the LO signal across diode 34. The use of properly selected values for the two series-connected capacitors 12 and 15, in accordance with the invention, gives better symmetry of the LO signals across diodes 32 and 34. Adjustment of the capacitances of capacitors 12 and 15 is made to achieve minimum leakage of the LO signal at junction 35.

The center of foil element 16 is returned to ground. A pair of diode self biasing networks, consisting of a resistor 22 and a parallel capacitor 24, and a resistor 26 and a parallel capacitor 28, are interposed between foil elements 16 and 18 and between foil elements 16 and 20, respectively. A capacitor 30 is connected across the ends of foil elements 18 and 20, as is a pair of mixing diodes 32 and 34. The secondary circuit consists of foil elements 16, 18 and 20 and capacitor 30. The secondary circuit is parallel resonant at the LO frequency, that is capacitor 30, together with other parasitic capacitances, tunes out the inductance of secondary circuit foil elements 16, 18 and 20. The advantage of this secondary circuit arrangement is that it obviates the need for a balun.

The primary and secondary circuits form a bandpass with component values and circuit element dimensions being selected for critical coupling to minimize LO signal losses, which LO signal is necessary to switch diodes 32,34 ON and OFF. The junction of the mixing diodes 32,34 serves as both an input port and an output port. The $1^{st}$ IF signal is "applied" to junction 35 through a capacitor 36 and the developed $2^{nd}$ IF signal is "taken" from junction 35 through an inductance 38.

It may be seen that for signals of about 920 MHz, capacitor 36 exhibits a very low impedance and inductor 38 exhibits a very high impedance, whereas for signals of 44 MHz, the opposite is true, i.e., capacitor 36 exhibits a very high impedance and inductor 38 exhibits a very low impedance. The diodes 32,34 are switched by the alternations of the induced $2^{nd}$ LO signal to alternate junction 35 between a high and a low impedance. Thus the $1^{st}$ IF signal is switched at the $2^{nd}$ LO frequency and mixing occurs. The much lower $2^{nd}$ IF frequency is taken through inductor 38. For simplicity, capacitor 36 and inductor 38 have been selected to implement the high $1^{st}$ IF/low $2^{nd}$ IF diplexing. It should be understood that higher order highpass and lowpass circuits are also contemplated. The operation of the circuit is well known and not part of the invention, which is directed to the foil element construction and the common input/output port for the $1^{st}$ and $2^{nd}$ IF signals in the secondary circuit.

What has been described is a novel printed single balanced RF downconverter mixer. It is recognized that numerous changes to the described embodiment of the invention will be apparent without departing from its true spirit and scope. The invention is to be limited only as defined in the claims.

What is claimed is:

1. A single balanced downconverter comprising:

an insulated substrate;

a series resonant primary circuit on one side of said insulated substrate for receiving a second local oscillator signal;

a pair of capacitors for symmetrically coupling said second local oscillator signal to said primary circuit for tuning out the inductance of said primary circuit at the local oscillator frequency;

a parallel resonant secondary circuit, mutually coupled to said primary circuit for receiving said second local oscillator signal, on the opposite side of said insulated substrate;

a pair of mixer diodes being coupled to said parallel resonant secondary circuit and simultaneously driven conductive and non conductive by said second local oscillator signal; and means for applying a $1^{st}$ IF input signal to, and for developing a $2^{nd}$ IF signal from, said pair of mixer diodes.

2. A single balanced downconverter comprising:

an insulated substrate;

a series resonant primary circuit on one side of said insulated substrate for receiving a second local oscillator signal;

a pair of substantially equal capacitors for symmetrically coupling said second local oscillator signal to said primary circuit for tuning out the inductance of said primary circuit at the local oscillator frequency;

a parallel resonant secondary circuit; mutually coupled to said primary circuit for receiving said second local oscillator signal, on the opposite side of said insulated substrate;

said primary circuit and said secondary circuit comprising first and second open annular foil elements, respectively, in juxtaposed relationship to each other;

a ground connection at the center of said second open annular foil element; and means for applying a $1^{st}$ IF input signal to, and developing a $2^{nd}$ IF signal from, said secondary circuit; said applying means including;

a pair of mixer diodes coupled across said second open annular foil element and simultaneously being driven conductive and nonconductive responsive to said second local oscillator signal; and a high pass network and a low pass network, commonly connected to said mixer diodes.

3. The downconverter of claim 2, wherein each of said self biasing networks comprises an R/C circuit.

4. The downconverter of claim 3, wherein said $2^{nd}$ IF signal is about 44 MHZ.

* * * * *